US009513106B2

(12) United States Patent
Nakanishi

(10) Patent No.: US 9,513,106 B2
(45) Date of Patent: Dec. 6, 2016

(54) WAVELENGTH TUNABLE LIGHT SOURCE

(71) Applicant: CANON KABUSHIKI KAISHA, Tokyo (JP)

(72) Inventor: Koichiro Nakanishi, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 21 days.

(21) Appl. No.: 14/528,791

(22) Filed: Oct. 30, 2014

(65) Prior Publication Data

US 2015/0146210 A1 May 28, 2015

(30) Foreign Application Priority Data

Nov. 23, 2013 (JP) ................. 2013-242425

(51) Int. Cl.
*G01B 9/02* (2006.01)
*H01S 5/14* (2006.01)
*H01S 5/183* (2006.01)
*H01S 3/105* (2006.01)

(52) U.S. Cl.
CPC ....... *G01B 9/02091* (2013.01); *G01B 9/02004* (2013.01); *G01B 9/02069* (2013.01); *H01S 5/14* (2013.01); *H01S 5/18366* (2013.01); *H01S 3/1053* (2013.01)

(58) Field of Classification Search
CPC ................................. G01B 9/02091
USPC ........................................ 356/479
See application file for complete search history.

(56) References Cited

U.S. PATENT DOCUMENTS

| 2007/0183643 | A1* | 8/2007 | Jayaraman | A61B 3/102 382/131 |
| 2008/0259971 | A1* | 10/2008 | Floyd | H01S 5/18366 372/20 |
| 2011/0280269 | A1* | 11/2011 | Chang-Hasnain | B82Y 20/00 372/50.1 |

FOREIGN PATENT DOCUMENTS

| JP | 2006-216722 A | 8/2006 |
| JP | 2007-178597 A | 7/2007 |
| WO | 2011-024968 A1 | 3/2011 |

OTHER PUBLICATIONS

Yano et al., "Wavelength Modulation Over 500 kHz of Micromechanically Tunable InP-Based VCSELs With Si-MEMS Technology", IEEE Journal of Selected Topics in Quantum Electronics, vol. 15, No. 3, May/Jun. 2009, pp. 528-534.

* cited by examiner

*Primary Examiner* — Tarifur Chowdhury
*Assistant Examiner* — Omar Nixon
(74) *Attorney, Agent, or Firm* — Fitzpatrick, Cella, Harper & Scinto

(57) ABSTRACT

To provide a wavelength tunable light source which can both ensure operation speed and reduce a drive voltage. A wavelength tunable light source according to the present invention includes a pair of reflectors at least one of which is a movable reflector, an active layer provided between the pair of reflectors, and a beam on part of which the movable reflector is formed and which is supported by a support member. The beam includes a blade part projecting between the support member and the movable reflector in a direction intersecting a stretching direction of the beam, and a center of gravity of the beam in the stretching direction is located at a distance less than half a length of the beam in the stretching direction.

19 Claims, 4 Drawing Sheets

WAVELENGTH TUNABLE LIGHT SOURCE

BACKGROUND OF THE INVENTION

Field of the Invention

The present invention relates to a wavelength tunable light source and an OCT (Optical Coherence Tomography) apparatus using the wavelength tunable light source. In particular, the present invention relates to a wavelength tunable light source and the like capable of varying oscillation wavelength by moving a reflecting mirror using, for example, a MEMS (Micro-Electromechanical System) mechanism as a wavelength tuning mechanism.

Description of the Related Art

In recent years, in the field of medical diagnostic imaging, a noninvasive, contactless, diagnostic method using near-infrared light has been studied, and the method is referred to as optical coherence tomography (OCT). Several OCT techniques are being studied, and OCT which uses a swept frequency source (Swept Source Optical Coherence Tomography: hereinafter referred to as SS-OCT), in particular, is drawing attention. A wide tunable range, narrow spectral line width, and high-speed operation are required of wavelength tunable light sources for SS-OCT. Specifically, a configuration which varies the oscillation wavelength by operating a vertical cavity surface emitting laser (hereinafter referred to as VCSEL) using a MEMS-based electrostatic actuator is disclosed by T. Yano et al. in "Wavelength Modulation Over 500 kHz of Micromechanically Tunable InP-Based VCSELs With Si-MEMS Technology," IEEE Journal of Selected Topics in Quantum Electronics, Vol. 15, No. 3, May/June 2009.

A configuration of a moving part of the wavelength tunable light source disclosed by T. Yano et al. is shown in FIG. 5A and FIG. 5B, where the moving part is driven by the electrostatic actuator. FIG. 5A is a top view and FIG. 5B is a sectional view taken along line 5B-5B in FIG. 5A. The wavelength tunable light source includes a moving part shown in FIG. 5A and FIG. 5B and a VCSEL substrate (not shown), and a wavelength-tuning operation is performed by varying spacing between a fixed mirror (not shown) on the side of the VCSEL substrate and a movable mirror 406 on the side of the moving part. The moving part driven by the electrostatic actuator is constructed from an SOI (Silicon-On-Insulator) substrate 414 and includes an Si substrate 400, an $SiO_2$ layer 402, and an Si layer 404 which is a beam material. The movable mirror 406 which is a dielectric layer is formed on a beam 412 made of the Si layer 404. When a voltage is applied to the Si substrate 400 and beam 412, electrostatic attraction acts through a gap 410 between the Si substrate 400 and beam 412, and then the Si beam 412 undergoes flexural deformation by being attracted to the Si substrate 400. Consequently, the movable mirror 406 is attracted toward the Si substrate 400 as well, changing the spacing from the fixed mirror (not shown) and thereby changing the oscillation wavelength of the VCSEL. Oscillating light is emitted through a light-extracting hole 408 formed in the Si substrate 400.

However, the moving part with the above configuration needs a high drive voltage ranging from 91 V to 151 V. With the technique disclosed by T. Yano et al., since the moving part is constructed from SOI while $SiO_2$ (the $SiO_2$ layer 402) with a high breakdown voltage is used for an insulating layer, a high drive voltage can be used for a driving voltage. However, in order to construct the moving part integrally with the VCSEL substrate, it is common practice to use a compound semiconductor (e.g., GaAs) highly consistent with the substrate, for the insulating layer, but this results in a breakdown voltage an order of magnitude lower than $SiO_2$. Consequently, the breakdown voltage cannot be increased.

A common technique used to reduce the drive voltage involves reducing the stiffness of the beam by increasing the length of the beam or using a material with a low Young's Modulus for the beam, but reduced stiffness of the beam can result in a reduced resonance frequency. In view of the above problem, an object of the present invention is to provide a wavelength tunable light source which allows a drive voltage to be reduced without reducing operation speed as well as to provide an apparatus which uses the wavelength tunable light source.

SUMMARY OF THE INVENTION

The present invention provides a wavelength tunable light source comprising: a pair of reflectors at least one of which is a movable reflector; an active layer provided between the pair of reflectors; and a beam on part of which the movable reflector is formed and which is supported by a support member, wherein the beam includes a blade part projecting between the support member and the movable reflector in a direction intersecting a stretching direction of the beam, and a center of gravity of the beam in the stretching direction is located at a distance less than half a length of the beam in the stretching direction.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

The present invention has the following features. A moving part includes a movable reflector; a beam made of an elastic material, configured to stretch toward a support member from the movable reflector, and supported by the support member; and a blade part (such as a movable electrode) linked to the beam, wherein a center of gravity of the entire moving part in a stretching direction of the beam is located at a distance less than half a length of the beam in the stretching direction. The blade part is linked to the beam at a distance less than half the length of the beam from the support member in the stretching direction. Advantages of the invention are achieved with this configuration. Typically, the blade part spaced away from the support member is made of the same material as the beam and formed unitary with the beam and the beam moves under a driving force of a driving force imparting part such as a fixed electrode and thereby changes a position of the movable reflector. Of course, the blade part may be formed separately and structured to be mounted across the beam. In that case, typically both blade part and beam receive the driving force from the driving force imparting part, but only the blade part may be designed to receive the driving force. The blade part can have any of various shapes including a linear shape and U-shape. A center of gravity of a portion around the blade part may be set at a distance less than half the length of the beam from the support member in the stretching direction.

Figure 1A:
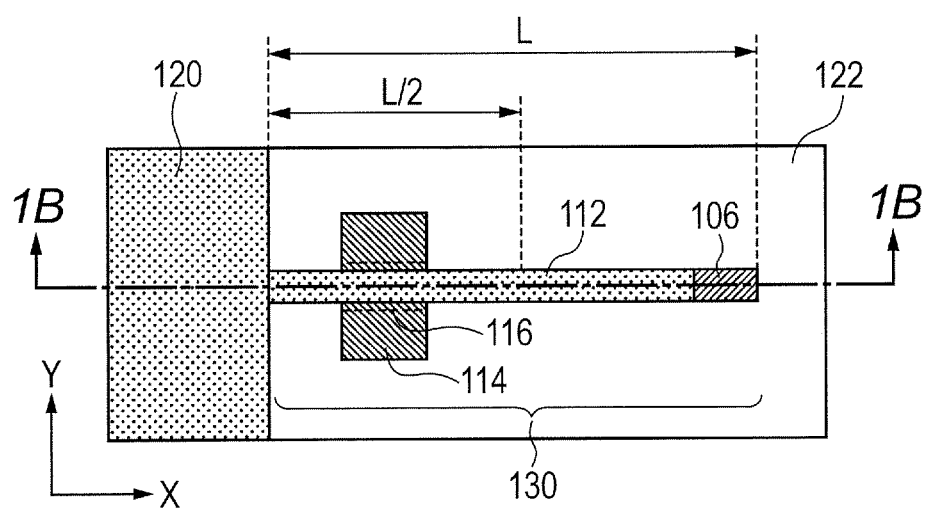
FIG. 1A is a top view showing a configuration of an embodiment of a wavelength tunable light source according to the present invention.
Figure 1B:
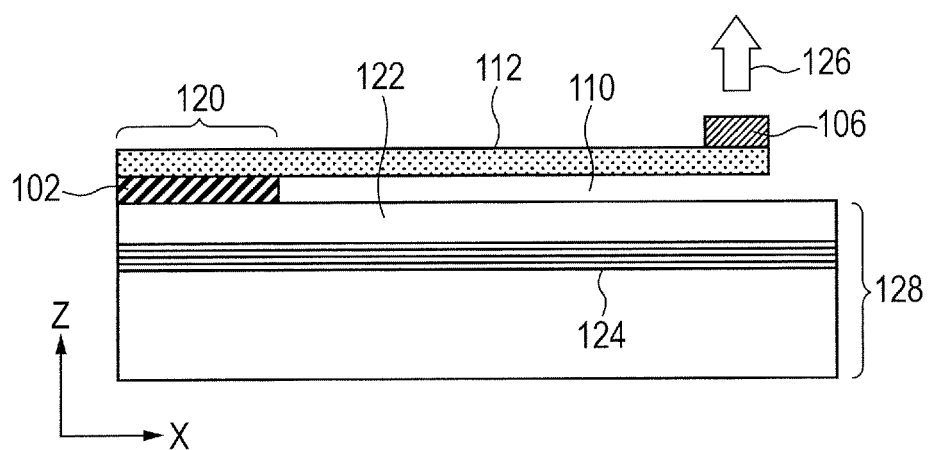
FIG. 1B is a sectional view taken along line 1B-1B in FIG. 1A.

An embodiment of a wavelength tunable light source according to the present invention will be described below. FIGS. 1A and 1B are diagrams showing a configuration of the embodiment of the wavelength tunable light source, where FIG. 1A is a top view and FIG. 1B is a sectional view taken along line 1B-1B in FIG. 1A. The present embodiment includes a VCSEL substrate 128 and a moving part 130, where the VCSEL substrate 128 includes a fixed mirror layer (fixed reflector) 124 which is a DBR (Distributed Bragg Reflector) made up, for example, of a semiconductor multilayer film while the moving part 130 is formed on the substrate 128. For example, a beam 112 having a movable mirror (movable reflector) 106 and a blade part 114 is supported by a support member 120, being spaced away from upper part of a fixed electrode 122 by a gap 110, to make up the moving part 130, where the movable mirror 106 is a dielectric multilayer DBR made of, for example, $TiO_2$ and $SiO_2$. In the moving part 130, both beam 112 and blade part 114 may function as movable electrodes or only the blade part 114 may function as a movable electrode. The beam 112 is made of a material having elasticity and is supported by a support member 120 by stretching towards the support member from the movable reflector. The blade part projects in a direction intersecting a stretching direction of the beam at a distance less than half the length of the beam from the support member in the stretching direction. The movable electrode (beam) 112 is electrically separated from the fixed electrode 122 by an insulating layer 102. The blade part 114 is spaced away from the support member 120. Also, the blade part 114 is linked to the beam 112 via a connecting portion 116. According to the present embodiment, the beam 112, movable electrode (blade part) 114 and connecting portion 116 are unitary formed of the same material.

As described above, the wavelength tunable light source according to the present embodiment includes an actuator equipped with the fixed electrode 122 and moving part 130, where the fixed electrode 122 serves as a driving force imparting part while the moving part 130 includes a movable electrode placed facing the fixed electrode 122. Furthermore, the wavelength tunable light source includes movable mirror 106 which is a movable reflector provided in the moving part, the fixed mirror layer 124 which is a fixed reflector, and a light generator which is installed between the movable reflector and fixed reflector. According to the present embodiment, the light generator is made up of a semiconductor layer and the like in a region of the fixed electrode 122. A wavelength of an electromagnetic wave generated by the light generator can be varied by varying a position of the movable reflector. The center of gravity of the moving part 130 in the stretching direction of the beam is located at a distance less than half the length of the beam from the support member (more accurately from an edge of the support member on the side of the movable mirror 106) in the stretching direction.

Next, operation of the variable wavelength light source in FIG. 1A and FIG. 1B will be described. Light is generated by exciting an active layer (not shown) which is the light generator formed on that location of the VCSEL substrate 128 which is closer to the movable mirror 106 than to the fixed mirror layer 124. An excitation unit can use an excitation method which is based on light excitation or current injection. The generated light is amplified in a resonator made up of the fixed mirror layer 124 and movable mirror 106 and is emitted as a laser beam 126. Wavelength tuning operation will be described. Wavelength of the laser beam 126 depends on length of the resonator made up of the fixed mirror layer 124 and movable mirror 106 and can be changed by changing spacing between the fixed mirror layer 124 and movable mirror 106. When a potential difference is provided between the fixed electrode 122 and the beam 112+blade part 114, the beam 112 is displaced in a Z direction by electrostatic attraction, changing a distance between the movable mirror 106 and fixed mirror layer 124 and thereby changing the wavelength of the laser beam 126.

Let V denote a potential difference to be provided, S1 denote the area of the blade part 114, S2 denote the area of the beam 112, and F denote electrostatic attraction acting on the beam 112 and movable electrode (blade part) 114, then equation (1) below holds.

$$F \propto (S1+S2)V^2 \qquad (1)$$

As can be seen from equation (1), the electrostatic attraction increases by the area (S1) of the blade part compared to when only the beam 112 is used. On the other hand, as the blade part 114 is added to the beam 112, the beam 112 increases in stiffness and becomes hard to bend, when the blade part 114 is separated from the support member 120 in the X direction in FIG. 1A, the increase in the stiffness of the moving part 130 is curbed. Consequently, the effect of the increase in the electrostatic attraction becomes superior, reducing a drive voltage can be achieved (curbing the increase in injection energy).

Also, if the blade part 114 is installed such that the center-of-gravity position of the moving part 130 is as close as possible to a tip of the beam 112, a larger moment is produced, which is advantageous in reducing the voltage. However, if the blade part 114 is installed such that the center of gravity of the moving part 130 is close to the tip of the beam 112, the mass of the tip portion increases. The tip portion has the largest displacement, and the increase in the mass leads to a significant reduction in the resonance frequency of the moving part 130. Thus, when the center of gravity of the moving part 130 in the stretching direction is placed at a distance less than half a length L of the beam stretching from the support member 120, a location of mass increase corresponds to a location of smaller displacement. This allows frequency reduction to be curbed while slightly increasing the stiffness of the beam, and thus, the drive voltage can be reduced without compromising displacement speed of the moving part. Here, the blade part 114 is sufficiently heavier than the movable mirror 106, and consequently, the center-of-gravity position of the moving part 130 in the stretching direction of the beam is located at a distance less than half the beam length L from the support member 120.

The reason why the center-of-gravity position of the moving part 130 is set at a distance less than half the beam length L will be described now. As an index which represents the performance of a structure, $(f \times T \times \sqrt{2})/(f^2+T^2)^{1/2}$ is defined, where f is the frequency of the moving part and T is the amount of displacement of the movable reflector of the moving part. According to studies conducted by the inventor, when the center-of-gravity position of the moving part 130 in the structure described above is located at a distance between approximately 25% and 65% of the beam length L from the support member 120, the index has a larger value than in the case of a structure without any additional electrode (the movable electrode 114), resulting in higher performance. It was found that when emphasis is placed on frequency, a suitable distance is between 25% and 40% of the beam length L from the support member 120. When these results are considered comprehensively, it is functionally suitable to set the center-of-gravity position of the moving part 130 at a distance less than approximately half the beam length L, and specifically suitable to set the center-of-gravity position at a distance of between approximately 25% and 40% of the beam length L from the support member 120.

In FIG. 1A, the connecting portion 116 linking the blade part 114 and beam 112 together is equal in length in the stretching direction of the beam to the movable electrode (blade part) 114, but the connecting portion may be made shorter, for example. It is not necessary that the center-of-gravity position of the connecting portion 116 in the stretching direction of the beam is matched with that of the movable electrode (blade part) 114 in the stretching direction of the beam. The moving part 130 may be formed unitary with the VCSEL substrate or may be produced separately and then joined to the VCSEL substrate. That is, in the latter case, the wavelength tunable light source may be formed by joining a VCSEL substrate containing a fixed reflector and a light generator to a movable structural substrate containing a moving part via an Au—Au joint or the like (see examples described later). Also, A semiconductor or dielectric DBR may be used for the fixed mirror layer 124 and/or movable mirror 106. Alternatively, for example, a high contrast grating (hereinafter abbreviated to HCG) may be used. In particular, the use of HCG, which is light in weight, is advantageous for speedups. Furthermore, regarding a method for driving the movable mirror, electromagnetic force may be used instead of the electrostatic force. For example, the blade part and beam may be constructed from a magnetic body while constructing the driving force imparting part on a stationary side from an electromagnet including a magnetic body and a coil.

Example 1

Figure 3:
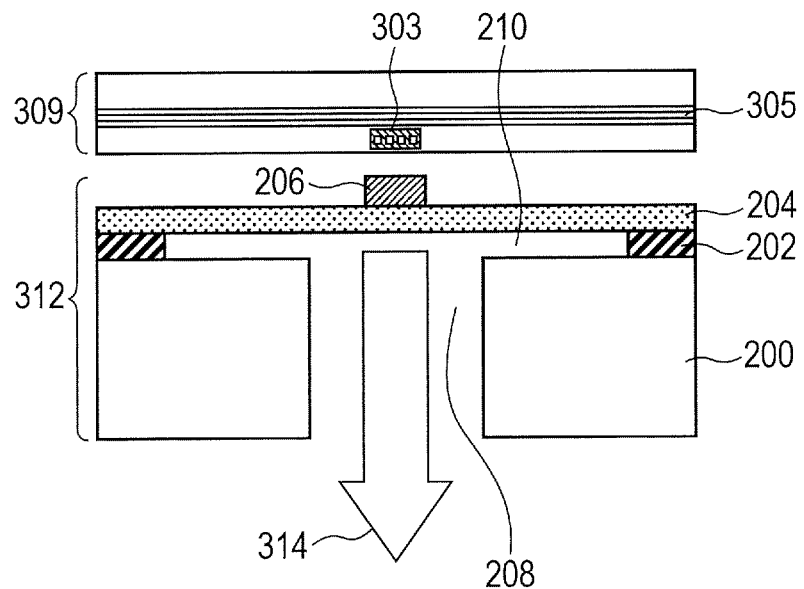
FIG. 3 is a sectional view showing a configuration of a wavelength tunable light source which is an example of the present invention.

Example 1 of the present invention will be described below. In the present example, a moving part is formed of an SOI substrate and joined to a VCSEL substrate to form a wavelength tunable light source. A sectional view of the wavelength tunable light source according to the present example is shown in FIG. 3. The wavelength tunable light source in FIG. 3 includes a VCSEL substrate 309, an active layer 303, and a fixed DBR mirror layer 305. A movable structural substrate 312 is prepared using an SOI substrate made up of a low-resistance Si substrate 200, a SiO$_2$ layer 202, and a low-resistance Si layer 204. An extracting hole 208 to extract a laser beam 314 is formed in the low-resistance Si substrate 200. Also, a gap 210 is formed between the low-resistance Si layer 204 and low-resistance Si substrate 200 by selectively etching the SiO$_2$ layer 202. A movable mirror 206 is formed of a dielectric DBR on the low-resistance Si layer 204. The VCSEL substrate 309 and movable structural substrate 312 are joined by a joint (not shown). In the present example, the following method is adopted as a joining method. That is, an Au thin film (100 nm thick) with Ti (5 nm thick) is formed as an insulating layer and adhesion layer of a desired thickness on each of the VCSEL substrate 309 and movable structural substrate 312, and the substrates are joined in vacuum under conditions of a 300° C. temperature and a 5 MPa pressure.

Figure 2A:
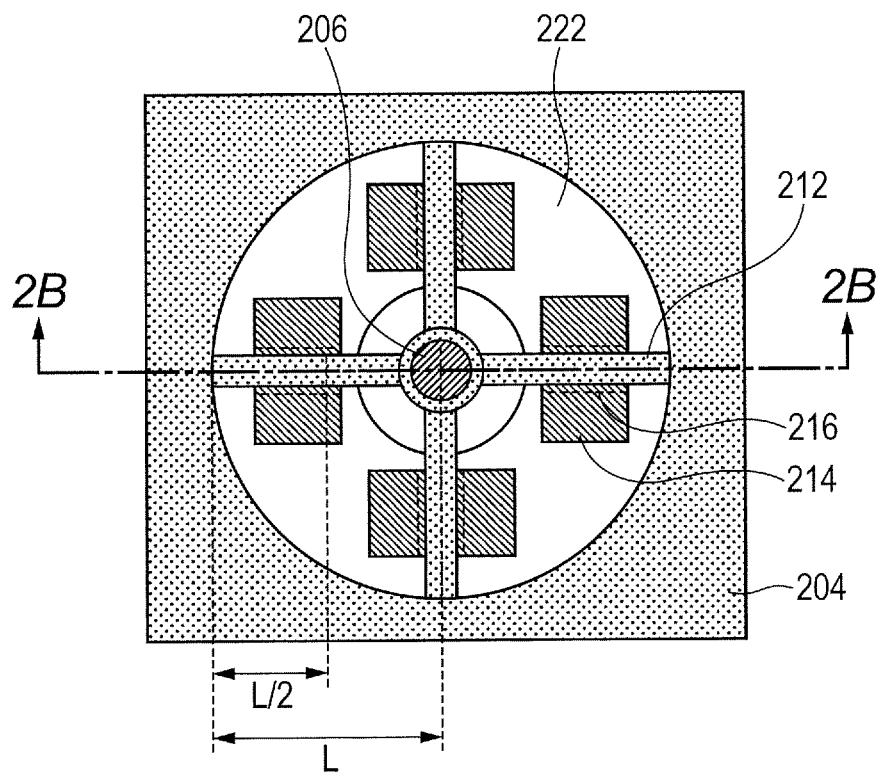
FIG. 2A is a top view showing a configuration of a moving part of a wavelength tunable light source in an example of the present invention.
Figure 2B:
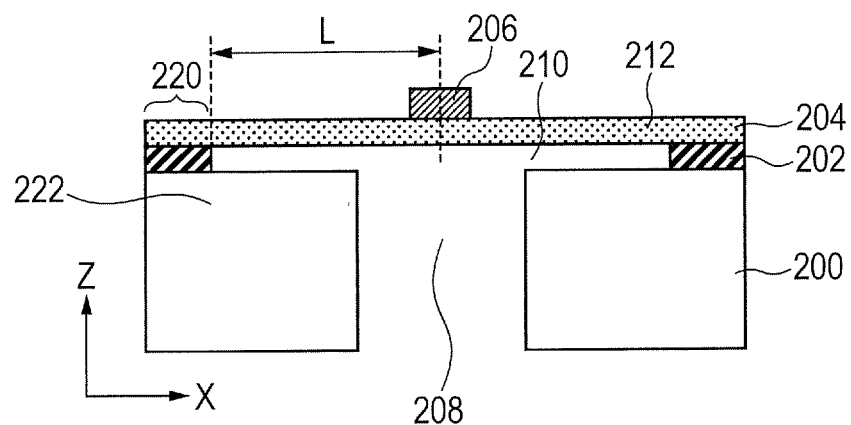
FIG. 2B is a sectional view taken along line 2B-2B in FIG. 2A.

Next, details of the movable structural substrate 312 will be described with reference to FIG. 2A and FIG. 2B. The beam structure supported at two end can be considered to be a cantilever beam structure, such as shown in FIG. 1A and FIG. 1B, placed at equal angular intervals around a movable mirror. FIG. 2A is a top view of a wavelength tunable light source and FIG. 2B is a sectional view taken along line 2B-2B. A beam 212 and blade part 214 are formed by patterning a low-resistance Si layer 204. In the present example, the low-resistance Si substrate 200 serves concurrently as a fixed electrode 222. A support member 220, which supports the beam 212, is constructed from the low-resistance Si layer 204 and unetched portions of the SiO$_2$ layer 202. As shown in FIG. 2A, the movable electrode 214 is connected to the beam 212 such that the center-of-gravity position of the connecting portion 216 in the stretching direction of the beam is placed at a distance less than half the beam length L from the support member 220. Consequently, the center-of-gravity position of the moving part 130 in the stretching direction of the beam is located at a distance less than half the beam length L from the support member 220 as described above. The movable mirror 206 is constructed by laminating TiO$_2$ and SiO$_2$ to a total thickness of 3 μm.

When a voltage is applied to the low-resistance Si substrate 200 and low-resistance Si layer 204, electrostatic attraction acts on those parts of the beam 212 and blade part 214 which face the fixed electrode 222 across the gap 210. Consequently, the beam 212 deforms so as to deflect toward the low-resistance Si substrate 200, causing the movable mirror 206 to be attracted to the low-resistance Si substrate 200. The SOI substrate in the present example were made up of low-resistance Si substrate (300 μm thick), SiO$_2$ layer (2 μm thick) and low-resistance Si layer (2 μm thick). Also, the beam length was L=200 μm, the light-extracting hole 208 was 100 μm in diameter, and the center-of-gravity position of the connecting portion 216 between the movable electrode 214 and beam 212 was 70 μm away from the support member 220, which corresponded to 35% the beam length L. Also, a wavelength tunable light source with a structure differing from Example 1 only in the absence of the movable electrode 214 was created as a comparative example and the resonance frequencies, voltages, and amounts of displacement of the two structures were measured. Results are shown in Table 1.

TABLE 1

|  | Resonance frequency | Voltage required for 225-nm displacement |
| --- | --- | --- |
| Present example | 78 kHz | 20 V |
| Comparative example | 66 kHz | 25 V |

As shown in Table 1, the voltage required in order to displace the movable mirror 206 by 225 nm was 25 V in the case of the comparative example, while 20 V in the case of the present example, which confirmed a voltage reduction of 20%. Also, the resonance frequency was 78 kHz in the present example compared to 66 kHz in the comparative example, showing a slight improvement. As described above, by installing the movable electrode on the beam away from the support member such that the center-of-gravity position of the connecting portion in the stretching direction of the beam is located at a distance less than half the beam length from the support member, the present example can reduce the drive voltage without reducing operation speed.

Example 2

Figure 4:
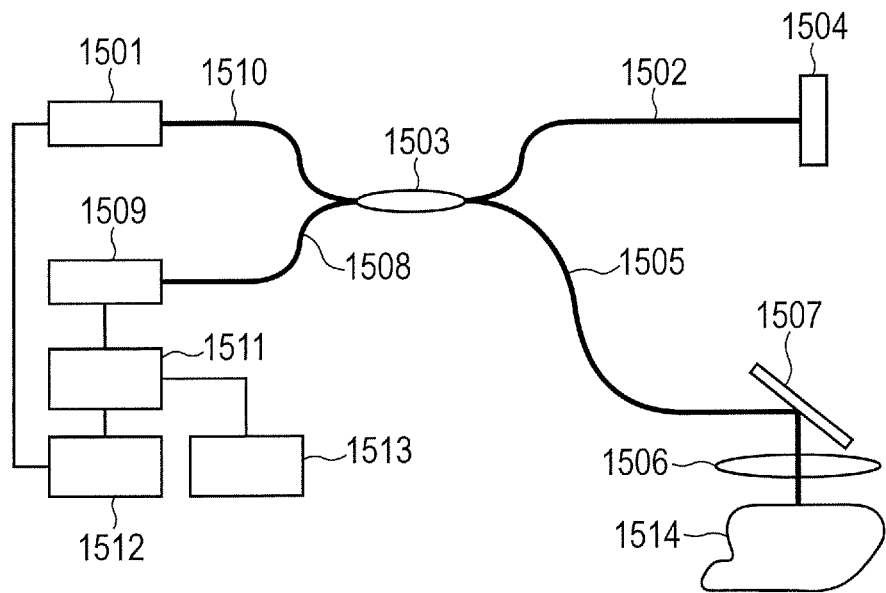
FIG. 4 is a schematic diagram showing an example of an optical coherence tomography apparatus which uses the light source according to the present invention.
Figure 5A:
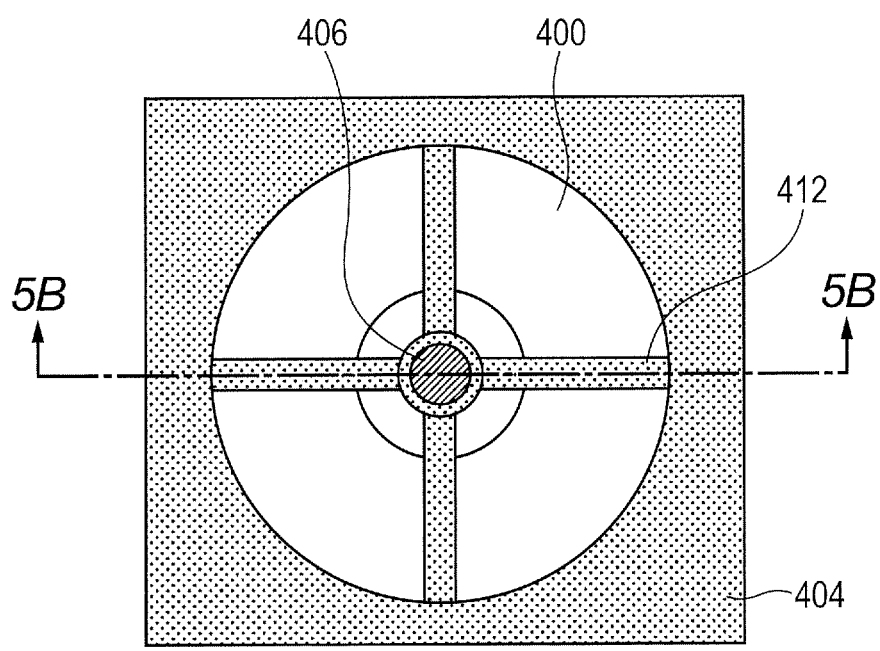
FIG. 5A is a top view of a moving part of a conventional wavelength tunable light source.
Figure 5B:
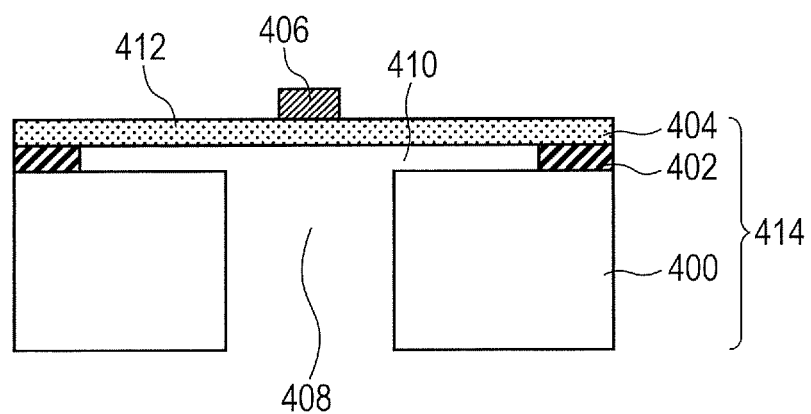
FIG. 5B is a sectional view taken along line 5B-5B in FIG. 5A.

An optical coherence tomography apparatus using the light source according to the present invention will be described in Example 2. FIG. 4 is a schematic diagram of the OCT apparatus according to the present example. The OCT apparatus in FIG. 4 is basically made up of the following components: a light source unit (1501), a specimen measuring unit (1507) adapted to illuminate a specimen with light emitted from the light source unit and transmit reflected light from the specimen, a reference unit (1502) adapted to direct the emitted light at a reference mirror and transmit reflected light from the reference mirror, an interference unit (1503) adapted to make the two reflected lights interfere with each other, a light detector unit (1509) adapted to detect interference light obtained by the interference unit, and an image processing unit (1511) adapted to perform image processing based on the light detected by the light detector unit (obtain a tomographic image, according to the present example).

Individual components will be described below. The light source unit includes a wavelength tunable light source 1501 and a light source control unit 1512 adapted to control the wavelength tunable light source. The wavelength tunable light source 1501 is connected to a fiber coupler 1503 via an optical fiber cable 1510 for illumination, where the fiber coupler 1503 makes up the interference unit. The fiber coupler 1503 of the interference unit is a single-mode fiber coupler which operates in a wavelength band of the wavelength tunable light source 1501 and is made up of various 3-dB couplers. A reflecting mirror 1504 is connected to a reference-beam light path fiber cable 1502, making up a reference unit, and the fiber cable 1502 is connected to the fiber coupler 1503.

A measuring unit is made up of an examination-light path fiber cable 1505, an illuminating-light condensing optical system 1506, and an illuminating position scanning mirror 1507, where the examination-light light path fiber cable 1505 is connected to the fiber coupler 1503. In the fiber coupler 1503, back-scattered light generated from the inside and surface of a test object (specimen) 1514 and return light from the reference unit interfere with each other, generating interference light. The light detector unit is made up of a light receiving fiber cable 1508 and a photodetector 1509, and the interference light generated by the fiber coupler 1503 is guided to the photodetector 1509. The light received by the photodetector 1509 is converted into a spectrum signal by a signal processing apparatus 1511, and depth information on the test object is acquired by further applying a Fourier transform to the spectrum signal. The acquired depth information is displayed as a tomographic image on an image output monitor 1513.

Here, the signal processing apparatus 1511 can be configured by a personal computer or the like and the image output monitor 1513 can be configured by a display screen or the like of the personal computer. A characteristic feature of the present example is the light source unit, and the oscillation wavelength and light intensity of the wavelength tunable light source 1501 as well as time variation thereof are controlled by the light source control apparatus 1512. The light source control apparatus 1512 is connected to the signal processing apparatus 1511 which controls a drive signal for the illuminating position scanning mirror 1507 as well, and the wavelength tunable light source 1501 is controlled in synchronization with driving of the scanning mirror 1507. For example, when the light source apparatus described in Example 1 is used for the wavelength tunable light source 1501 according to the present example, the light source apparatus, which can be wavelength-swept over a wide band at high speed, can acquire tomographic image information with a high depth resolution at high speed. The OCT apparatus is useful for tomographic imaging in ophthalmology, dentistry, dermatology, and the like.

Being capable of increasing driving forces such as electrostatic attraction acting on the beam, the present invention can curb increases in injection energy such as a drive voltage. Also, since the increase in the mass caused by the blade part occurs on the side of the support member of the beam and the stiffness of the beam is increased by the blade part, the present invention can keep operation speed from falling.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-242425, filed Nov. 23, 2013, which is hereby incorporated by reference herein in its entirety.

What is claimed is:

1. A wavelength tunable light source comprising:
   a pair of reflectors, at least one of which is a movable reflector;
   an active layer provided between the pair of reflectors; and
   a beam on part of which the movable reflector is formed and which is supported by a support member,
   wherein the beam includes a blade part projecting between the support member and the movable reflector in a direction intersecting with a stretching direction in which the beam stretches from the support member to the movable reflector, and
   a distance from the support member to a center of gravity of the beam in the stretching direction is less than half of a distance from the support member to the movable reflector in the stretching direction.

2. The wavelength tunable light source according to claim 1, wherein the distance from the support member to the center of gravity of the beam in the stretching direction is 25% or more and 40% or less of the distance from the support member to the movable reflector in the stretching direction.

3. The wavelength tunable light source according to claim 1, wherein the blade part is spaced away from the support member.

4. The wavelength tunable light source according to claim 1, further comprising a fixed electrode placed facing the beam, wherein:
   at least the blade part is a movable electrode; and
   the fixed electrode and the movable electrode are configured such that an electrostatic force is applied between the fixed electrode and the movable electrode.

5. The wavelength tunable light source according to claim 4, wherein the blade part and the beam are movable electrode.

6. The wavelength tunable light source according to claim 1, wherein the blade part is formed unitary with the beam.

7. The wavelength tunable light source according to claim 1, wherein the blade part and the beam are separate members.

8. The wavelength tunable light source according to claim 1, wherein the distance from the support member to the blade part in the stretching direction is less than half of the distance from the support member to the movable reflector in the stretching direction.

9. The wavelength tunable light source according to claim 1, wherein a connecting portion connecting the beam and the blade part is closer to the support member than the blade part in the stretching direction of the beam.

10. The wavelength tunable light source according to claim 1, wherein a center-of-gravity position of a connecting portion connecting the beam and the blade part in the stretching direction of the beam is not matched with a center-of-gravity position of the blade part in the stretching direction of the beam.

11. The wavelength tunable light source according to claim 1, wherein the active layer includes a semiconductor.

12. The wavelength tunable light source according to claim 1, wherein at least one of the pair of reflectors includes a distributed Bragg reflector.

13. The wavelength tunable light source according to claim 1, wherein at least one of the pair of reflectors includes a high contrast grating.

14. An apparatus comprising: the wavelength tunable light source according to claim 1; a specimen measuring unit adapted to illuminate a specimen with light from the wavelength tunable light source and transmit reflected light from the specimen, a reference unit adapted to direct the light from the wavelength tunable light source at a reference mirror and transmit light from the reference mirror, an interference unit adapted to make the two lights interfere with each other; a light detector unit adapted to detect interference light obtained by the interference unit; and an image processing unit adapted to perform image processing based on the interference light detected by the light detector unit.

15. A wavelength tunable light source comprising:
a pair of reflectors, at least one of which is a movable reflector;
an active layer provided between the pair of reflectors; and
a beam on part of which the movable reflector is formed and which is supported by a support member,
wherein the beam includes a blade part projecting between the support member and the movable reflector in a direction intersecting with a stretching direction in which the beam stretches from the support member to the movable reflector.

16. The wavelength tunable light source according to claim 15, wherein a distance from the support member to the blade part in the stretching direction is less than half of a distance from the support member to the movable reflector in the stretching direction.

17. The wavelength tunable light source according to claim 15, wherein a distance from the support member to the blade part in the stretching direction is 25% or more and 40% or less of a distance from the support member to the movable reflector in the stretching direction.

18. The wavelength tunable light source according to claim 15, wherein a connecting portion connecting the beam and the blade part is closer to the support member than the blade part in the stretching direction of the beam.

19. An apparatus comprising: the wavelength tunable light source according to claim 15; a specimen measuring unit adapted to illuminate a specimen with light from the wavelength tunable light source and transmit reflected light from the specimen, a reference unit adapted to direct the light from the wavelength tunable light source at a reference mirror and transmit light from the reference mirror, an interference unit adapted to make the two lights interfere with each other; a light detector unit adapted to detect interference light obtained by the interference unit; and an image processing unit adapted to perform image processing based on the interference light detected by the light detector unit.

* * * * *